United States Patent [19]

Katoh

[11] Patent Number: 5,017,958
[45] Date of Patent: May 21, 1991

[54] IMAGE FORMING APPARATUS HAVING CONTROL UNIT FOR REWINDING OPERATION OF PHOTOSENSITIVE RECORDING MEDIUM

[75] Inventor: Tokunori Katoh, Ichinomiya, Japan

[73] Assignee: Brother Kogyo Kabushiki Kaisha, Japan

[21] Appl. No.: 578,261

[22] Filed: Sep. 6, 1990

[30] Foreign Application Priority Data

Sep. 14, 1989 [JP] Japan .............................. 1-108107[U]
Nov. 21, 1989 [JP] Japan .................................. 1-302803

[51] Int. Cl.⁵ ...................... G03B 27/32; G03B 27/52
[52] U.S. Cl. .................................................... 355/27
[58] Field of Search .................. 355/27, 205, 207, 50; 354/297–304; 430/138; 226/49; 242/186, 71

[56] References Cited

U.S. PATENT DOCUMENTS

| 4,797,710 | 1/1989 | Ishikawa | 355/27 |
| 4,827,356 | 5/1989 | Yamamoto et al. | 358/302 |
| 4,903,070 | 2/1990 | Nakata et al. | 355/27 |
| 4,922,286 | 5/1990 | Tanabe | 355/27 |
| 4,935,768 | 6/1990 | Ibuchi | 355/27 |
| 4,935,769 | 6/1990 | Ogura | 355/27 |
| 4,941,014 | 7/1990 | Ogura | 355/27 |
| 4,945,382 | 7/1990 | Yui et al. | 355/27 |
| 4,952,968 | 8/1990 | Ibuchi | 355/27 |
| 4,959,681 | 9/1990 | Ogura | 355/27 |
| 4,965,622 | 10/1990 | Ibuchi | 355/27 |
| 4,970,548 | 11/1990 | Shibata et al. | 355/72 |

Primary Examiner—Richard A. Wintercorn
Attorney, Agent, or Firm—Oliff & Berridge

[57] ABSTRACT

An image forming apparatus for performing a series of image forming operations, comprising an exposure unit for exposing the photosensitive recording medium to an image light to form a latent image thereon in a first exposure process, a pressure-developing unit for superposing the photosensitive recording medium over a developer medium under pressure to form a visible image on the developer/medium, sheet feeding rollers for feeding the photosensitive recording medium through the exposing unit and the pressure-developing unit in forward and reverse directions to thereby perform sheet feeding and rewinding operations, respectively, the photosensitive recording medium being fed back in the rewinding operation after pressure-developed by the pressure-developing unit to dispose an unexposed area of the photosensitive recording medium in the first exposure process to a predetermined position where the unexposed area is subjected to a second exposure process subsequent to the first exposure process, and a control unit for ceasing all of the image forming operations when any abnormality occurs during at least one of the image forming operations, wherein the control means controls the sheet feeding means to continue the sheet rewinding operation irrespective of occurrence of the abnormality if it is judged that the abnormality does not disturb the sheet rewinding operation.

8 Claims, 8 Drawing Sheets

IMAGE FORMING APPARATUS HAVING CONTROL UNIT FOR REWINDING OPERATION OF PHOTOSENSITIVE RECORDING MEDIUM

BACKGROUND OF THE INVENTION

This invention relates to an image forming apparatus such as a copying machine using a longitudinal photosensitive recording medium, and more particularly to an image forming apparatus in which a photosensitive recording medium after subjected to an exposure process is rewound so as to completely feed back an unexposed portion of the photosensitive recording medium to a predetermined position where the unexposed portion can be subjected to a next exposure process when any abnormality having no influence on the rewinding operation occurs, thereby effectively using the photosensitive recording medium with no vainness.

There has been conventionally known an image forming apparatus using a photosensitive recording medium and a developer (transfer) sheet in which the photosensitive recording medium is exposed to light to form a latent image thereon in an exposure unit, and then superposed over the developer sheet under pressure in a pressure-developing unit to thereby develop the latent image on the photosensitive recording medium into a visible image on the developer sheet.

In this type of the image forming apparatus, a prescribed area (latent image forming area) of the photosensitive recording medium is exposed to light to form a latent image thereon, and then is fed through the pressure-developing unit beyond a separation unit for separating the photosensitive recording medium to the developer sheet. Thereafter, a next exposure process is conducted on a next latent image forming area of the photosensitive recording medium to form another latent image thereon, and then it is fed beyond the separation unit. In this case, an unexposed area (non-latent image forming area) of the photosensitive recording medium which has not been exposed to light in a previous exposure process, is also fed to a position between the exposure unit and the pressure developing unit, beyond the pressure-developing unit, or further beyond the separation unit. That is, the unexposed area (non-latent image forming area) of the photosensitive recording medium in the previous exposure process is not newly used to form a latent image thereon in the next exposure process, and this causes a vain use of the photosensitive recording medium. In order to prevent the photosensitive recording medium from being vainly used in the conventional image forming apparatus, an unexposed area of the photosensitive recording medium which has not been exposed to light in an exposure process and fed between the exposure unit and the pressure developing unit or beyond the separation unit after the exposure process, is fed back (rewound) to the front side of the exposure unit after the pressure-developing process is carried out. Thereafter, the unexposed area of the photosensitive recording medium is subjected to a next or subsequent exposure process to form another latent image thereon.

Further, in the conventional image forming apparatus, if any abnormality for indicating an error of a series of image forming operations such as ah exposure operation, a sheet feeding operation and so on is detected during a rewinding operation of the photosensitive recording medium, all of the image forming operations including the rewinding operations are once ceased, and restored after remedying the abnormality. In this case, a next exposure operation for the photosensitive recording medium is newly commenced for the photosensitive recording medium even though the unexposed area of the photosensitive recording medium is not completely fed back to the predetermined position (that is, even though the unexposed area is not positioned in or in front of the exposure unit (for example, between the exposure unit and the pressure-developing unit)). Therefore, even in the image forming apparatus adopting the rewinding operation of the photosensitive recording medium, a large part of the unexposed area in a previous exposure process is not used for forming a latent image thereon in the next exposure process, and a vain use of the photosensitive recording medium is not completely prevented. As a result, a running cost can not be reduced in this image forming apparatus.

Still further, in this image forming apparatus, if any abnormality is detected during a sheet feeding operation of the developer sheet while superposed over the photosensitive recording medium, all of the operations are once ceased and commenced after the abnormality is remedied. In this case, if the abnormality is one for indicating a lack of the transfer sheet, a break of the lamp (light source) or the like which does not hinder the developer sheet from being fed through the separation unit, only the sheet feeding operation of the developer sheet is not ceased and thus continued until the developer sheet is fed beyond the separation unit. After the developer sheet is fed beyond the separation unit, all of the operations including the sheet feeding operation are ceased. This sheet feeding operation of the developer sheet causes the photosensitive recording medium including an exposed area to be also fed beyond the separation unit together with the developer sheet. As described above, however, a next exposure operation for the photosensitive recording medium is newly commenced even though the unexposed area of the photosensitive recording medium is not completely rewound to the predetermined position. Therefore, immediately after the abnormality is remedied and all of the operations are commenced, a next exposure process is carried out even though the unexposed area of the photosensitive recording medium is not completely rewound to the predetermined position, and thus the unexposed area of the photosensitive recording medium is not used for the next exposure operation. This also causes the photosensitive recording medium to be vainly used.

SUMMARY OF THE INVENTION

An object of this invention is to provide an image forming apparatus capable of completely rewinding an unexposed area of a photosensitive recording medium to a predetermined position where it can be subjected to a next exposure operation even though any abnormality is detected to a series of image forming processes and if the abnormality does not hinder the rewinding operation of the unexposed area of the photosensitive recording medium.

In order to attain the above object, an image forming apparatus for performing a series of image forming operations in which a photosensitive recording medium is exposed to light to form a latent image on the photosensitive recording medium and superposed over a developer medium under pressure to develop the latent image on the photosensitive recording medium into a visible image on the developer medium, comprises exposing means for exposing the photosensitive recording medium to an image light to form a latent image thereon in a first exposure process, pressure-developing means for superposing the photosensitive recording medium having the latent image thereon over a developer medium under pressure, to thereby form a visible image corresponding to the latent image on the developer medium, sheet feeding means for feeding the photosensitive recording medium through the exposing means and the pressure-developing means in forward and reverse directions to thereby perform sheet feeding and rewinding operations, respectively, the photosensitive recording medium being fed back in the rewinding operation after pressure-developed by the pressure-developing means to dispose an unexposed area of the photosensitive recording medium in the first exposure process to a predetermined position where the unexposed area is subjected to a second exposure process subsequent to the first exposure process, and control means for ceasing all of the image forming operations when any abnormality occurs during at least one of the image forming operations, wherein the control means controls the sheet feeding means to continue the sheet rewinding operation irrespective of occurrence of the abnormality if it is judged that the abnormality does not disturb the sheet rewinding operation.

DETAILED DESCRIPTION OF THE INVENTION

Figure 1:
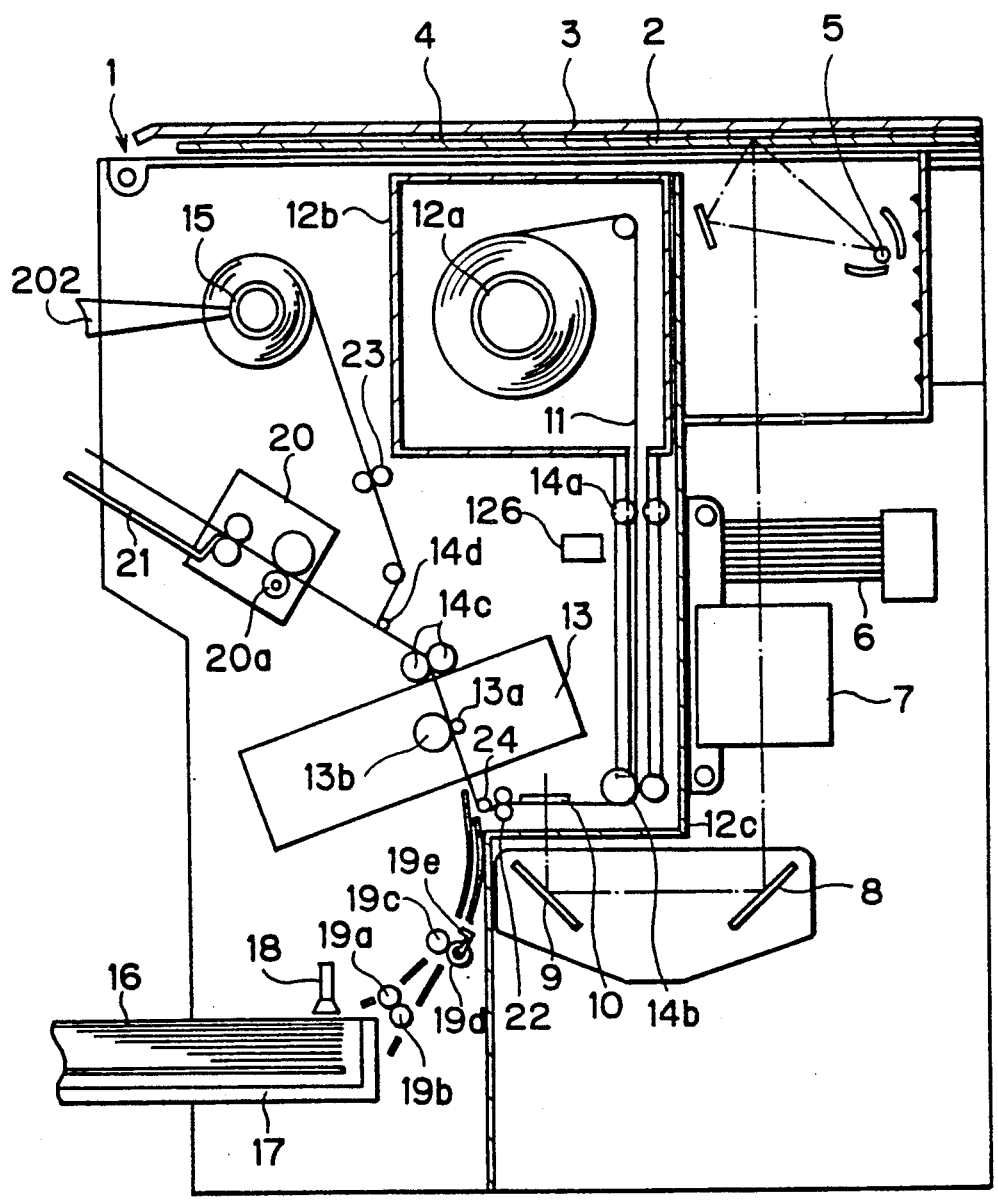
FIG. 1 shows an image forming apparatus according to this invention.

An image forming apparatus according to this invention will be described with reference to FIG. 1, which schematically shows as a photosensitive and pressure-sensitive copying machine capable of copying a full-color image on a visible image forming medium.

The photosensitive and pressure-sensitive copying machine 1 (hereinafter referred to simply as a "copying machine 1") according to this invention employs a photosensitive and pressure-sensitive recording sheet such as a microcapsule sheet serving as a latent image forming medium, and a photosensitive sheet such as a developer sheet serving as a visible image forming medium.

The copying machine 1 includes an upper panel assembly having an original stand glass 2 which is movable back and forth and an original stand cover 3 that can be placed over the original stand cover 2. An original 4 to be copied is placed face down on the original stand glass 2.

The copying machine 1 also has a light source 5 placed in an upper right portion thereof, the light source 5 comprising a halogen lamp and a semicylindrical reflecting mirror. The light source 5 emits a linear light through a slit formed in an upper panel of the copying machine 1 toward the original stand glass 2. The light emitted from the light source 5 is passed through the transparent original stand glass 2, and is reflected by the original 4 placed on the original stand glass 2. The original 4 on the original stand glass 2 is exposed to light while moved horizontally, thereby performing a scanning operation of the original 4 with the light.

The light reflected by the original 4 is passed through a filter unit 6 to a lens 7. The filter unit 6 comprises plural color filters for adjusting a color tone (balance) of an image to be copied, and the lens 7 is used to project the light whose colors are adjusted by the filter unit 6 onto a pair of reflecting mirrors 8 and 9. The reflecting mirrors 8 and 9 are mounted on a mirror supporting plate which is slightly positionally adjustable to vary the length of the light path and the focusing condition. The light passed through the lens 7 is deflected by two reflecting mirrors 8 and 9, as shown in FIG. 1, and is then irradiated on an elongated microcapsule sheet 11 which is positioned along an exposure stand 10.

The elongated microcapsule sheet 11 is wound around a cartridge shaft 12a which is placed in a cartridge 12b removably installed in the housing of the copying machine 1. The cartridge 12b has an outlet slot for feeding out the microcapsule sheet 11, and near the outlet slot of the cartridge 12b is provided a sheet empty sensor 126 serving as a sheet feeding condition detecting means for detecting at least one of the leading end and trailing end of the microcapsule sheet to determine presence and absence of the microcapsule sheet in the sheet feed path, thereby determining a feeding condition of the microcapsule sheet which is being fed to and along the sheet feed path. As the sheet empty sensor, an optical sensor or a lever sensor, or combination thereof may be used (the optical sensor 126 may be representatively used in this embodiment).

For example, when the sheet empty sensor is used to detect whether the residual quantity of the microcapsule sheet 11 wound on the cartridge shaft 12a becomes zero (that is, the sheet empty sensor is used to detect the trailing end of the microcapsule sheet), the sheet empty sensor produces a detection signal indicative of no residue of the microcapsule sheet wound around of the cartridge shaft 12a.

A leader having a certain length is attached to the leading end of the microcapsule sheet 11 and extends through a sheet feed roller 14a, a guide roller 14b, K-shafts 22 (for example, a driving roller and a nip roller) which are movable toward and away from each other by a K-shaft moving motor (not shown) to thereby switching opening and closing states to each other, a dancer roller 24, sheet feed rollers 14C, a pressure-developing unit 13, a separation unit 14d, F-shafts (final shafts) 23 (for example, meander travel control rollers) which are movable toward and away from each other by an F-shaft moving motor (not shown) to switching opening and closing states to each other, toward a take-up shaft 15 to which an automatic sheet feed lever 202 is attached. More specifically, the microcapsule sheet 11 drawn out of the lower end portion of the cartridge 12b is fed and guided by the sheet feed rollers 14a and the guide rollers 14b, and extends beneath the exposure stand 10. Then, the microcapsule sheet 11 passes through the K-shafts 22 and the dancer roller 24 into the pressure developing unit 13. The microcapsule sheet 11 which has passed through the pressure-developing unit 13 is fed by the feed rollers 14c, travels past the separation unit 14d and the F-shafts 23, and is then wound on the take-up shaft 15. The microcapsule sheet 11 discharged from the cartridge 12b remains unexposed by a light-shielding cover 12c. The speed at which the microcapsule sheet 11 is fed is controlled so as to be equal to a certain speed, i.e., the speed at which the original stand glass 2 moves, so that a latent image can be formed successively line by line on the microcapsule sheet 11 when it moves past the exposure stand 10.

A sheet cassette 17 serving as a sheet supply unit is disposed below the pressure-developing unit 13. The sheet cassette 17 is detachably mounted in the housing of the copying machine 1. A sheet supply means 18 in the form of a suction cup for attracting a sheet under vacuum is associated with the sheet cassette 17. The sheet cassette 17 stores a stack of developer sheets as recording sheets. The developer sheets 16 are taken out of the cassette 17 one by one by the sheet supply means 18 under negative pressure. The developer sheet 16 which is taken from the cassette 17 is delivered by a sheet fee roller 19a and a pinch roller 19b. After the leading end of the developer sheet 16 is positioned by rollers 19c, 19d and a resist gate 19e, the developer sheet 16 is fed into the pressure-developing unit 13. In place of the suction cup, a sector roller (not shown) may be provided to feed the developer sheets 16 toward the pressure-developing unit 13 one by one. Further, in addition to the suction cup or the sector roller, the developer sheet cassette 17 may be provided with a projection (not shown) for indicating the size of the developer sheets accommodated in the cassette 17. In this case, a size detection unit (not shown) for judging the size of the developer sheet in accordance with the projection is provided to the copying machine.

The microcapsule sheet 11 and the developer sheet 16 are closely contacted with each other under pressure when they are introduced into the pressure-developing unit 13. The microcapsule-coated surface of the microcapsule sheet 11 which carries a latent image and the developer-coated surface of the color developer sheet 16 are held in contact with each other in the pressure developing unit 13. The pressure developing unit 13 includes a smaller-diameter roller 13a and a backup roller 13b, by and between which the microcapsule sheet 11 and the color developer sheet 16 are sandwiched and pressed together. At this time, those microcapsules on the microcapsule-coated surface which are not exposed are ruptured under pressure, thereby forming a developed (visible) image on the developer sheet 16.

The microcapsule 11 and the developer sheet 16 which have left the pressure-developing unit 13 are separated from each other by the separation unit 14d. The developer sheet 16 travels into a heat-fixing unit 20 in which a heater roller 20a promotes color development on the color developer sheet 16 and fixes the color image on the developer sheet 16. Thereafter, the developer sheet 16 is discharged into a discharge tray 21 by discharge rollers. The separated microcapsule sheet 11 travels past the F-shafts 23, and is then wound around the take-up shaft 15.

In this invention, in addition to the above elements, a control unit is provided to the image forming apparatus. The control unit controls all of a series of image forming processes, and in addition, further performs two types of control operations. One type of control operation (hereinafter referred to as "a first control operation") is to control a rewinding operation of the photosensitive recording medium (hereinafter referred to as "microcapsule sheet") when any abnormality occurs during the rewinding operation and thus the microcapsule sheet is stopped between the exposure unit and pressure-developing unit, or beyond the pressure-developing unit. The other type of control operation (hereinafter referred to as "a second control operation") is to control a rewinding operation when an abnormality which does not disturb a sheet feeding operation of the developer sheet and thus the microcapsule sheet is fed beyond the separation unit together with the developer sheet (image transfer sheet).

Figure 2:
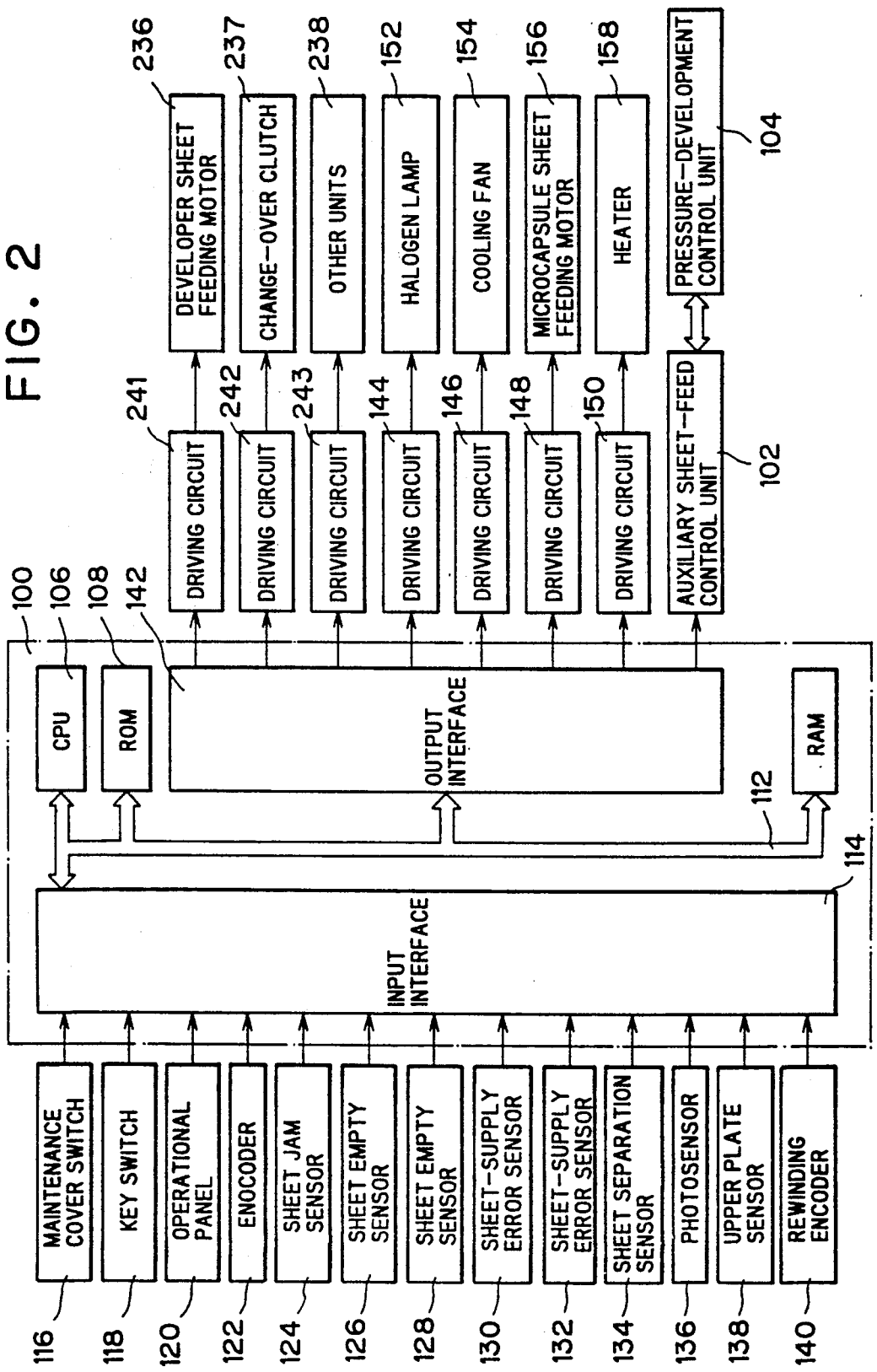
FIG. 2 is a block diagram for a control unit used in the image forming apparatus as shown in FIG. 1.

FIG. 2 shows a block diagram of the control unit according to this invention.

The control unit according to this invention comprises a main control unit 100 for controlling the whole operations for obtaining a color image in the apparatus. The main control unit 100 mainly comprises a microcomputer including a CPU 106 serving as an operation ceasing means, a ROM 108, a RAM 110, input and output interfaces 114 and 142 for inputting and outputting various signals therethrough, respectively, and a bus 112 for connecting these elements to one another. The main control unit 100 is connected through the input interface 114 to various elements for detecting and setting operational conditions for a series of image forming processes, so that various signals for indicating operation conditions of the image forming processes and instructions inputted from an external side are inputted to the main control unit 100. Further, other various elements for mechanically and electrically performing a series of image forming processes and the first and second control operations are connected through the output interface 142 to the main control unit 100, so that various control signals for controlling driving of the elements are outputted from the main control unit 100 to these elements.

For example, as shown in FIG. 2, the main control unit 100 is connected through the input interface 114 to a maintenance cover switch 116 for control a driving of the apparatus in accordance with opening and closing states of a maintenance cover (not shown), a key switch 118 for starting a driving of the apparatus by inserting a driving key and rotating it right or left, an operational panel 120 provided with an information input key such as a key for switching single and continuous copying operations to each other, a copy-start indicating switch and so on, encoders 122 for detecting sheet feed amounts of the microcapsule sheet and the developer sheet, for example, by detecting a rotational angle of each of a microcapsule sheet feeding motor 156 for driving the microcapsule sheet feed roller 14a and a developer sheet feeding motor 236 for driving the developer sheet feed roller 19c respectively, a sheet jam sensor 124 for detecting sheet jam of a microcapsule sheet 11 and a developer sheet 16 during a sheet feeding operation of the microcapsule sheet 11 and the developer sheet 16, sheet empty sensors 126 and 128 for detecting empty (lack) of the microcapsule sheet 11 and the developer sheet 16 respectively, sheet-supply error sensors 130 and 132 for detecting a sheet supply error of the microcapsule sheet 11 and the developer sheet 16 respectively, a sheet separation sensor 134 for detecting a complete separation between the microcapsule sheet 11 and the developer sheet 16, a photosensor 136 for detecting an amount of light emitted from the halogen lamp 152 of the light source 5 to thereby judge as to whether the halogen lamp 152 is broken, an upper plate sensor 138, a rewinding encoder 140 for detecting a rewinding amount of the microcapsule sheet 11, and other elements.

Further, the main control unit 100 is connected through the output interface 142 to an auxiliary sheet-feed control unit 102 for controlling the sheet feed operation of the developer sheet and the microcapsule sheet after a pressure-development process to thereby perform the first control operation, and further connected through driving circuits 144, 146, 148, 150, 241, 242 and 243 to the halogen lamp 152, a cooling fan 154, a microcapsule sheet feeding motor 156 for rotating the microcapsule sheet feed roller 14a and the driving shaft 22, a heater 158, a developer sheet feeding motor 236, a change-over clutch 237 for reversing a sheet feeding direction, and other elements such as a moving unit for moving the original stand and so on so that various driving and ceasing signals are outputted from the CPU 100 through the output interface 142 to these elements. The auxiliary sheet-feed control unit 102 is further connected to a pressure-development control unit 104.

Figure 3:
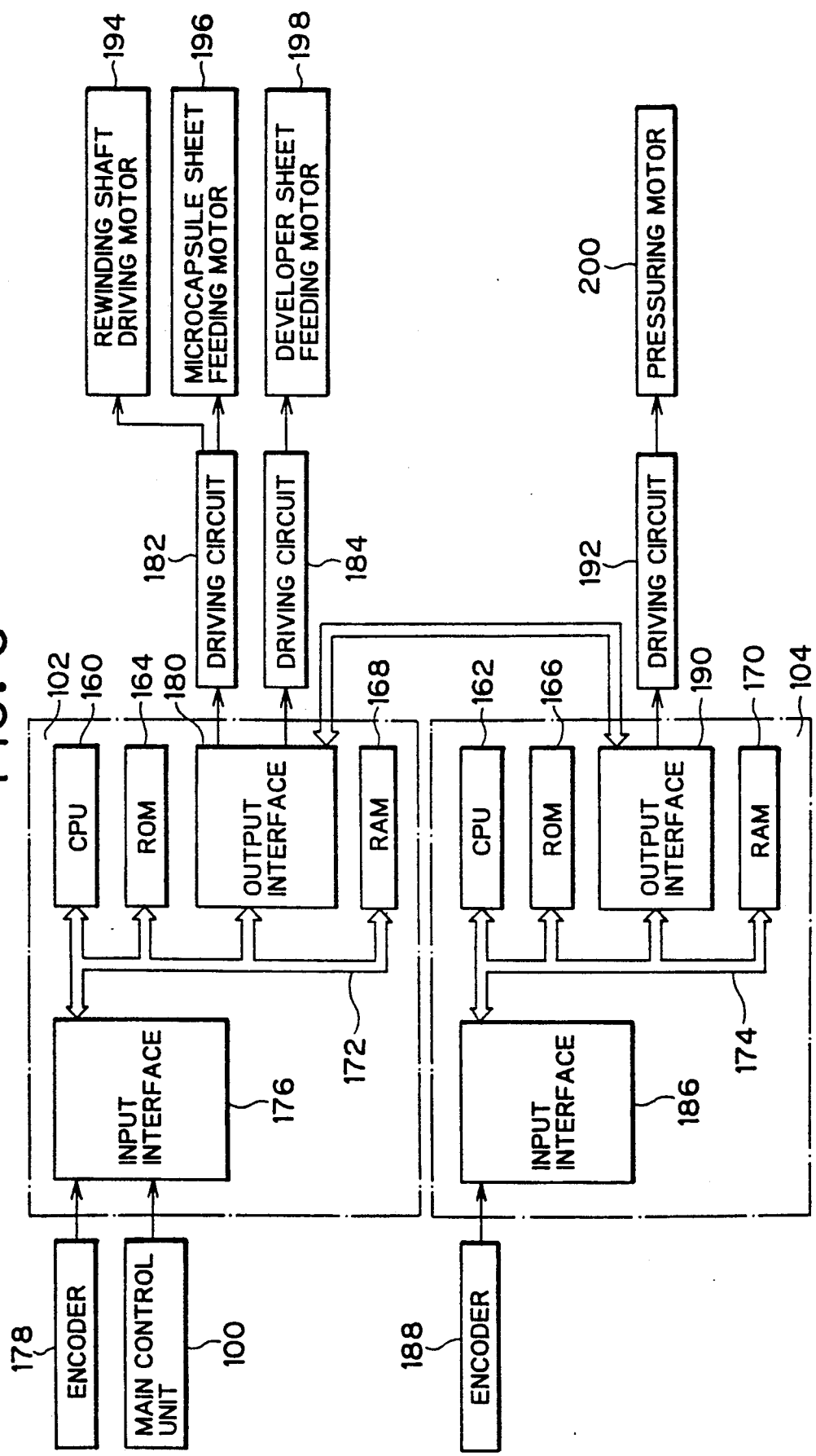
FIG. 3 is block diagrams for an auxiliary sheet-feed control unit and a pressure-development control unit.

FIG. 3 is a block diagram of the auxiliary sheet-feed control unit 102 and the pressure-development control unit 104 which perform the first control operation in combination thereof.

The auxiliary sheet-feed control unit 102 controls a feeding operation of the developer sheet 16 and the microcapsule sheet 11 after pressure-developed, and the pressure-development control unit 104 controls an approach and alienation between the pressure rollers 13a and 13b.

Each of the control units 102 and 104 mainly comprises an one-chip type of microcomputer, and in detail comprises a CPU 160 (162), a ROM 164 (166), a RAM 168 (170), input and output interfaces 176 (186) and 180 (190), and a bus 172 (174) for connecting these elements to one another.

The input interface 176 of the auxiliary sheet-feed control unit 102 is connected to an encoder 178 for detecting a rotational angle of a microcapsule sheet feeding motor 196 and the main control unit. On the other hand, the output interface 180 is connected to the pressure-development control unit 104, and further connected through driving circuits 182 and 184 to the microcapsule sheet feed motor 196 for rotating the small-diameter roller 13a, the backup roller 13b, sheet feed roller 14c and F-shafts 23, and to a developer sheet supply motor 198 for rotating the sheet feed roller 19a, the pinch roller 19b, the developer sheet feed rollers 19c and 19d, respectively.

The input interface 186 of the pressure-development control unit 104 is connected to an encoder 188 for detecting a rotational angle of a pressure supply motor 200 serving to approach the small-diameter roller 13a and the backup roller 13b to each other and alienate these rollers away from each other, and the output interface 190 of the pressure-development control unit 104 is connected through a driving circuit 192 to the pressure supply motor 200.

The first control operation of the image forming apparatus of this invention will be first described hereunder with reference to FIGS. 1 to 3.

In the image forming apparatus as shown in FIG. 1, the CPU 106 as shown in FIG. 2 serves as an operation ceasing means for ceasing all of the image forming operations when any abnormality is detected during a rewinding operation of an unexposed portion of the photosensitive recording medium (microcapsule sheet) disposed beyond the exposure unit after a developing process, and the CPU 160 as shown in FIG. 3 serves as a cease releasing means for judging as to whether the abnormality does not disturb the rewinding operation of the microcapsule sheet 11 after all of the image forming operations are ceased by the operation ceasing means, and then driving only the microcapsule sheet feed motor 156 (as shown in FIG. 3) for rewinding the microcapsule sheet 11 when it is judged by the CPU 160 that the abnormality does not disturb the rewinding operation.

Figure 4:
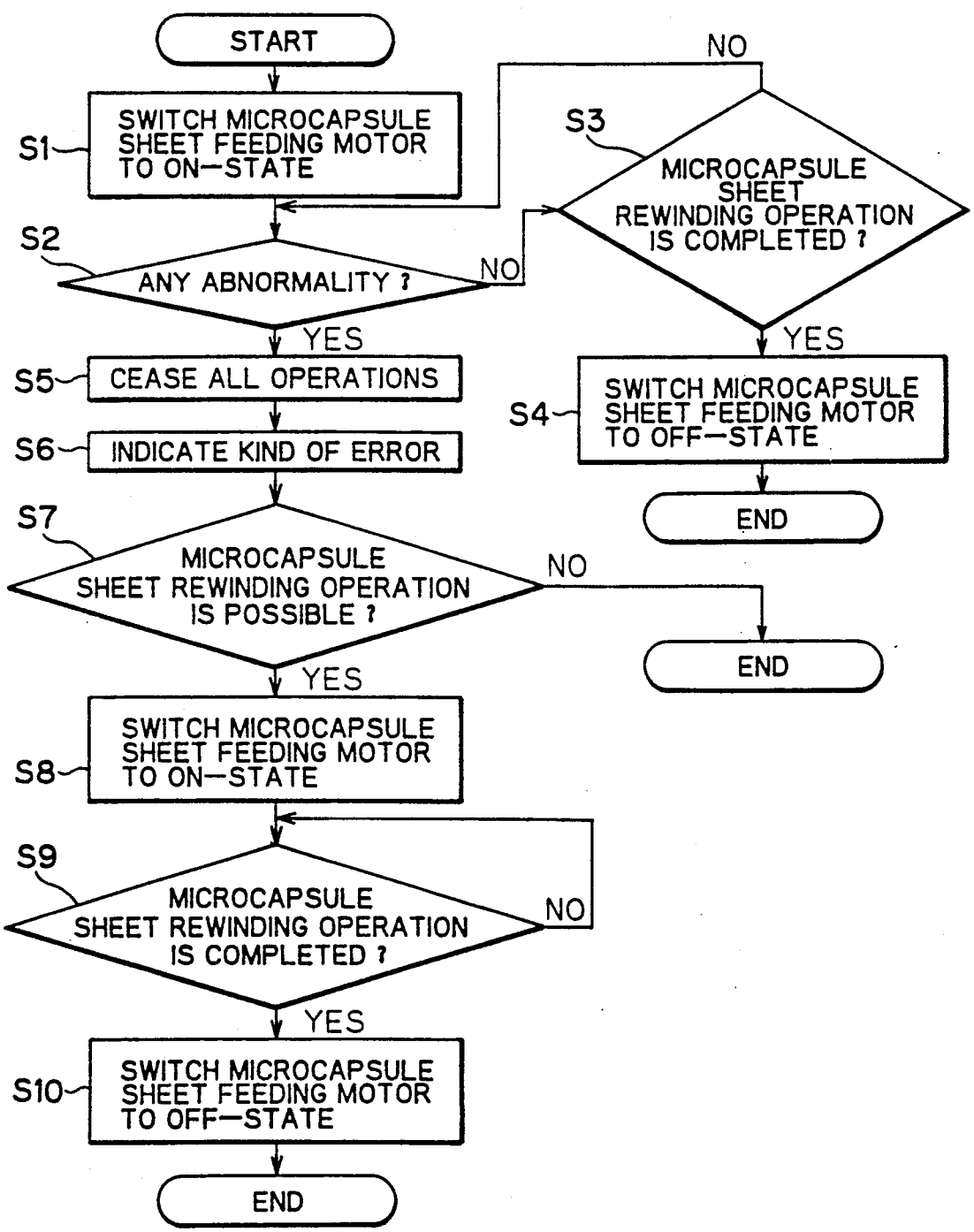
FIG. 4 is a flow-chart for showing one embodiment of a control operation of a series of image forming operations.

FIG. 4 is a flow-chart for showing a control operation of the CPUs 106 and 160.

First, the CPU 160 starts the microcapsule sheet feed motor 156 at a step S1, and the CPU 106 judges whether any abnormality occurs in the apparatus at a step S2. The step goes to the step S3 when the abnormality is not detected at the step S2, and the steps S2 and S3 are alternatively and repetitively executed until an unexposed area located in the rear side of the latent image forming area of the photosensitive recording medium is wholly fed back to the exposure unit. After the rewinding operation is completed, at a step S4 the CPU 160 ceases the driving of the microcapsule sheet feed motor 156, and waits for a next copying operation.

If the CPU 106 judges at the step S2 that any abnormality occurs in the apparatus, the step goes to a step S5 and the CPU 106 ceases all of the operations to make an error indication at the step S6. Thereafter, the CPU 160 judges at a step S7 as to whether the abnormality disturbs the rewinding operation of the photosensitive recording medium. If it is judged by the CPU 160 that the abnormality disturbs the rewinding operation and thus the rewinding operation is impossible, all of the operations continue to be ceased until the abnormality is completely remedied. On the other hand, if it is judged at the step S7 that the abnormality does not disturb the rewinding operation and thus only the rewinding operation can be continued, at a step S8 the CPU 160 drives the microcapsule sheet feed motor 156 to feed the microcapsule sheet 11 in a direction reverse to a sheet feed direction, so that the rewinding operation of the photosensitive recording medium is restored. Thereafter, the CPU 160 judges at a step S9 as to whether the unexposed area of the microcapsule sheet is rewound beyond the exposure unit. If the rewinding operation is not completely carried out, this judging operation of the rewinding operation by the CPU 160 is repeated. If it is judged by the CPU 160 at the step S9 that the rewinding operation is completely carried out, at a step S10 the CPU 160 ceases the driving of the microcapsule sheet feed motor 156.

An operation for judging as to whether a detected abnormality disturbs the rewinding operation will be described below.

Figure 5:
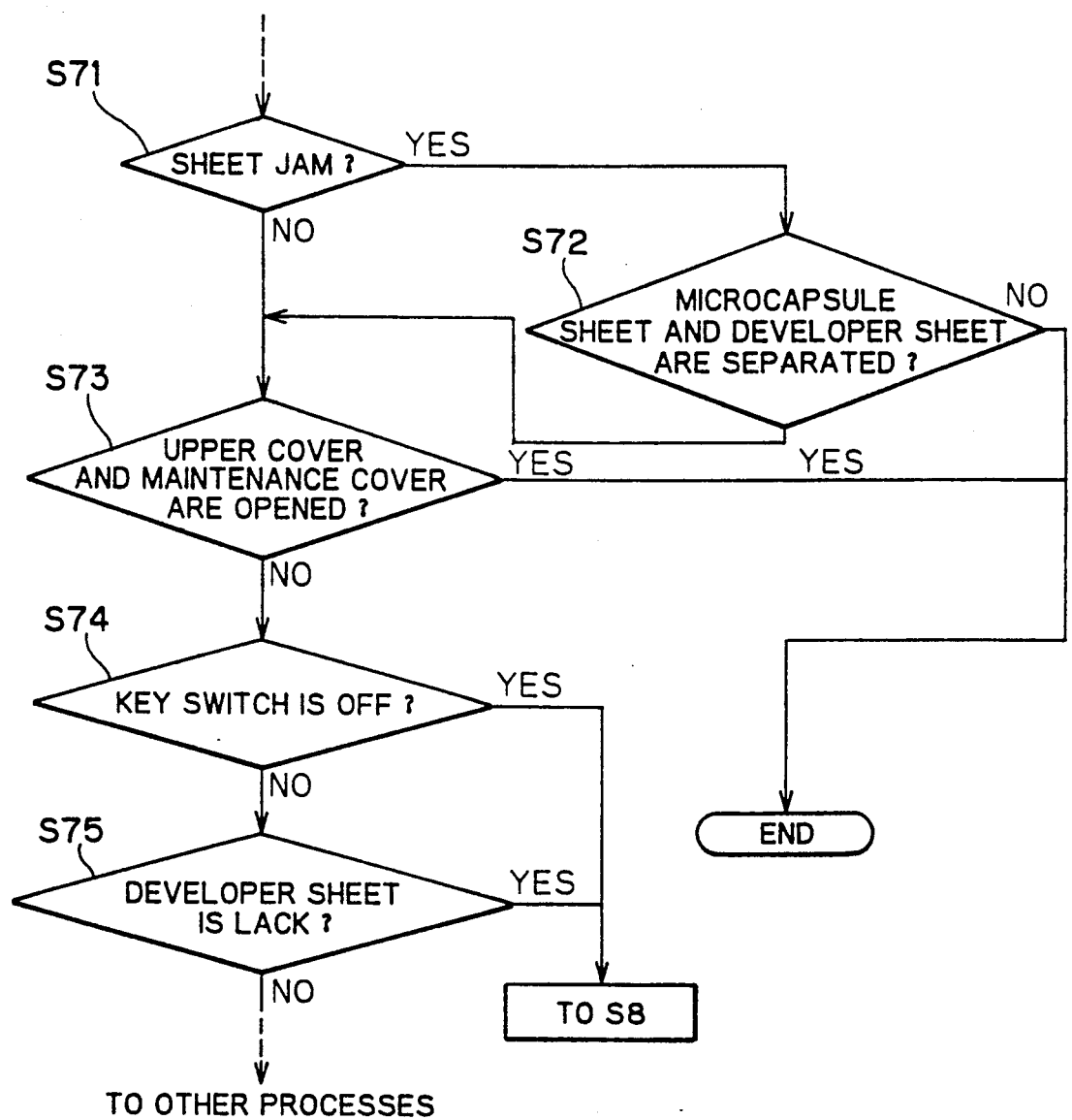
FIG. 5 is a flow-chart for showing one embodiment of a judging operation for judging whether an abnormality disturbs a rewinding operation of the photosensitive recording medium.

FIG. 5 is a flow-chart for showing a judging operation of the CPU 160 for judging as to whether the detected abnormality disturbs the rewinding operation.

At a step S71, the CPU 160 judges on the basis of a detection signal from the sheet jam sensor 124 as to whether the abnormality is caused by a sheet jam, and the step goes to a step S72 when the signal indicates the sheet jam. After the sheet jam is judged at the step S71, at a step S72 it is judged on the basis of a signal from the sheet separation sensor 134 whether the microcapsule sheet 11 and the developer sheet 16 are completely separated from each other. If it is judged that these sheets 11 and 16 are completely separated from each other, the step goes to the step S73, and if it is judged that these sheets 11 and 16 are not completely separated, it is determined that the rewinding operation is impossible. If the abnormality is not caused by the sheet jam, or if the abnormality is caused by the sheet jam and the sheets 11 and 16 are completely separated from each other, the step goes to a step S73.

On the basis of a signal from the maintenance cover switch 116 or the upper plate opening sensor 138, it is judged at the step S73 whether at least one of the maintenance cover and the upper plate is opened. If it is judged at the step S73 that at least one of the maintenance cover and the upper plate is opened, it is judged that the rewinding operation is impossible because an user may be damaged. On the other hand, if no abnormality occurs in the maintenance cover or the upper plate, it is judged on the basis of a key switch signal at a step S74 whether the key switch 118 is in an ON-state. The key switch 118 serves to cease the driving of the apparatus insofar as the key switch 118 is in an OFF-state (even though a main power source is in an ON-state). The Off-state of the key switch 118 does not disturb the rewinding operation of the microcapsule sheet, and therefore the microcapsule sheet feed motor 156 is driven. When the key switch 118 is not in the OFF-state, it is judged on the basis of a signal from the sheet-lack sensor 128 at a step S75 whether the developer sheet 16 is lack, and drives the microcapsule sheet feed motor 156 if the developer sheet is empty.

A judgment in the step S9 is made by calculating a sum of rewinding amounts of the microcapsule sheet before and after the abnormality is detected, and the rewinding operation is completed until the sum is equal to a predetermined amount. The rewinding encoder 140 is provided to the shaft 14b, and outputs a pulse signal to the CPU 106 at a predetermined interval during the rewinding operation. The CPU 106 counts the number of the pulse signals to calculate the rewinding amount of the microcapsule sheet.

As described above, on the basis of the signals outputted from the various sensors, the kind of the abnormality is detected and it is judged whether the rewinding operation is possible. Accordingly, even though any abnormality occurs during a rewinding operation in which the unexposed area for the previous exposure process is rewound to the exposure unit for the next exposure process, the rewinding operation is continued insofar as the abnormality does not disturb the rewinding operation. As a result, the unused areas of the microcapsule sheet, which are not used to form a latent image in the exposure process, are more reduced in area, and a running cost of the apparatus can be reduced.

This invention is not limited to the above embodiment, and any modification may be made insofar as it is not departed from the subject matter of this invention as follows.

Figure 6:
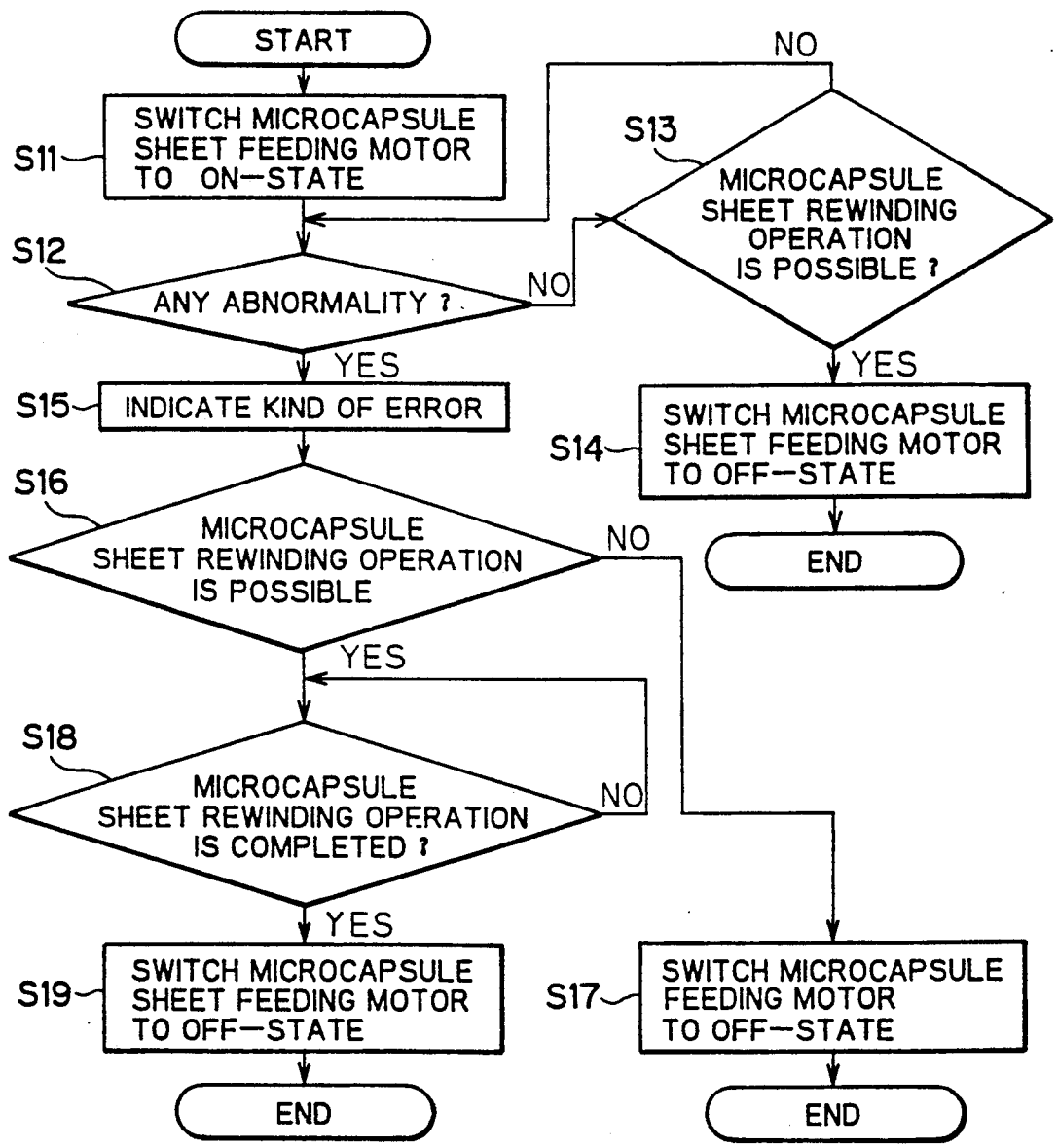
FIG. 6 is a flow-chart for showing a modification of the control operation as shown in FIG. 4.

In the above embodiment, after all of the operations in the apparatus are once ceased, it is judged whether the rewinding operation of the microcapsule sheet is possible. However, in place of the above method, the following method may be used. That is, immediately after any abnormality is detected, it is judged by the control unit whether the rewinding operation of the microcapsule sheet is possible, and then the image forming operations except for the rewinding operation is ceased if the rewinding operation is judged to be possible, or is ceased by switching the microcapsule sheet feed motor to an OFF-state if the rewinding operation is judged to be impossible. A series of the above steps are executed in accordance with a flow-chart as shown in FIG. 6.

First, the microcapsule sheet feed motor 156 is driven at a step S11, and then it is judged at a step S12 whether any abnormality occurs in the apparatus. The step goes to a step S13 if no abnormality is detected at the step S12, and the steps S12 and S13 are alternatively and repetitively executed until the unexposed portion of the microcapsule sheet is judged to be completely rewound to the exposure unit at the step S13. After the rewinding operation is completed, at a step S14 the microcapsule sheet feed motor 156 is ceased and waits for a next copying operation. If any abnormality is detected at the step S12, the step goes to a step S15, and an error indication is made at the step S15. At a step S16, it is judge whether the abnormality disturbs the rewinding operation of the microcapsule sheet. If it is judged at the step S16 that the abnormality disturbs the rewinding operation and thus the rewinding operation is impossible, the microcapsule sheet feed motor 156 is ceased until the abnormality is remedied. If it is judged at the step S16 that the rewinding operation is possible, it is judged at a step S18 whether the unexposed portion for a previously-formed latent image is completely rewound, the judging operation is repeated if the rewinding operation is not completed. If it is judged at the step S18 that the microcapsule sheet is completely rewound, at a step S19 the driving of the microcapsule sheet feed motor is ceased.

Figure 7:
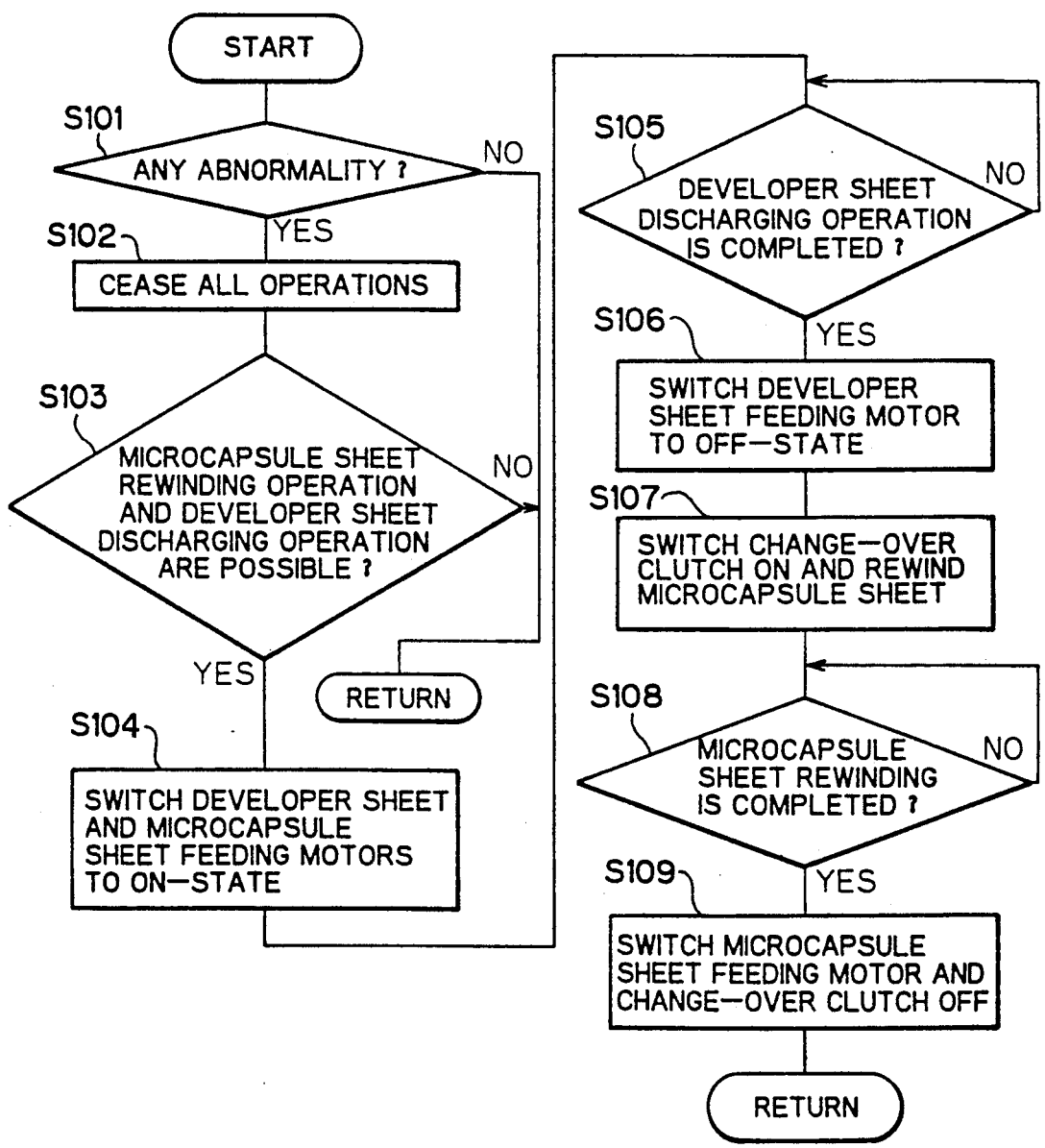
FIG. 7 is a flow-chart for another embodiment of the control operation of the image forming operations.
Figure 8:
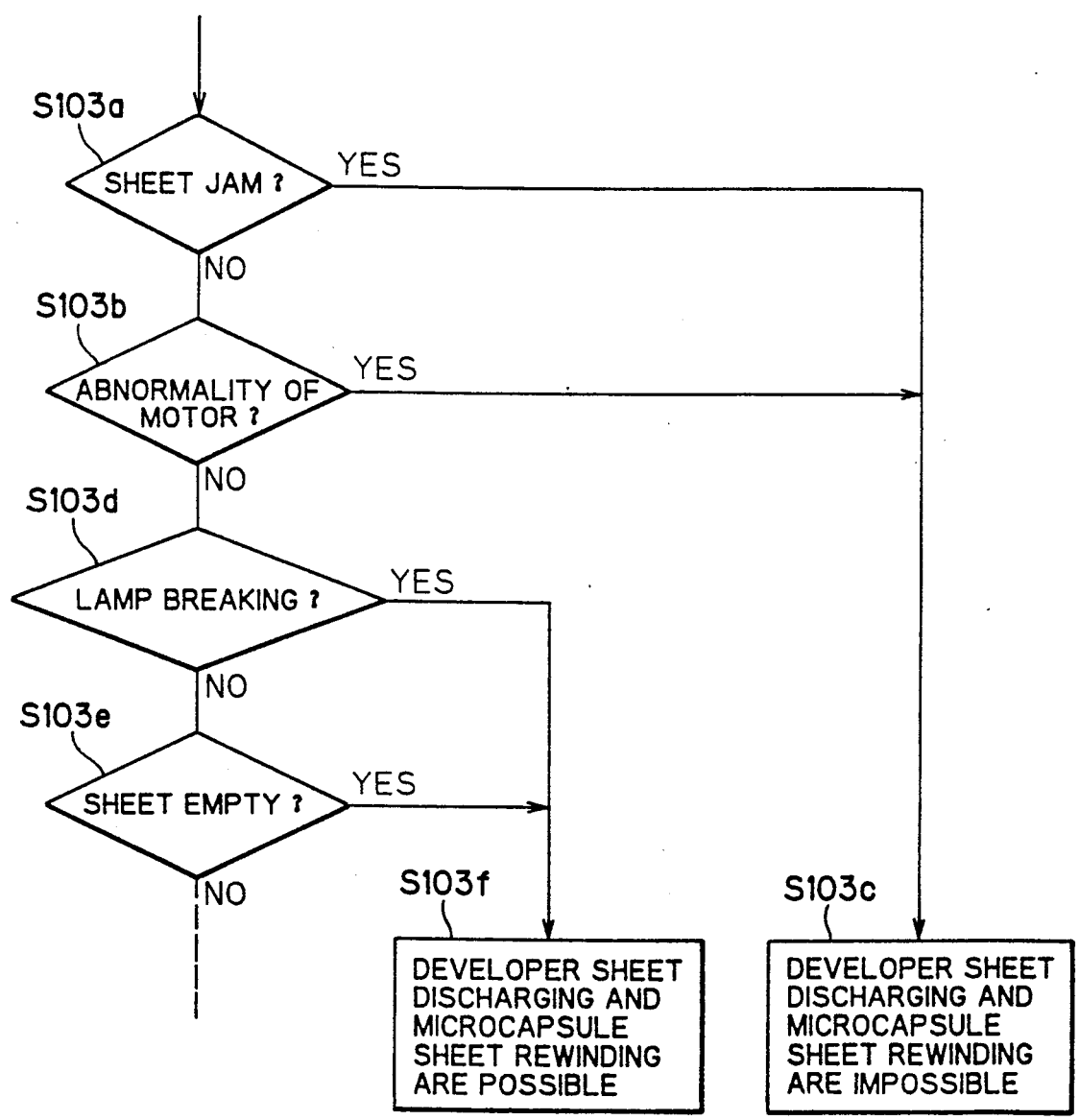
FIG. 8 is a flow-chart for showing another embodiment of the judging operation for judging whether an abnormality disturbs the rewinding operation of the photosensitive recording medium.

The second control operation of the image forming apparatus will be next described hereunder with reference to FIGS. 7 and 8.

When the trailing end portion of a latent image which is formed on the microcapsule sheet 11 in an exposure process for a single copying operation or a last exposure operation for a continuous copying operation is fed through the pressure-developing unit 13 beyond the separation roller 14d, the control unit 106 drives the change-over clutch 237 to reverse the sheet feeding direction of the microcapsule sheet 11 and commence the rewinding operation of the unexposed portion of the microcapsule sheet. Further, when any abnormality occurs in the apparatus during the continuous copying operation, the control unit 106 ceases the whole operations of all elements including the microcapsule sheet feeding motor 156 and the developer sheet feeding motor 236. Thereafter, the control unit 106 judges whether the abnormality disturbs the rewinding operation of the microcapsule sheet 11 and a discharging operation of the developer sheet 16 to the discharge tray 21, and drives the both sheet feeding motors 156 and 236 and the change-over clutch 237 to perform the discharging operation of the developer sheet 16 to the discharge tray 21 and the rewinding operation of the unexposed portion of microcapsule sheet to the exposure unit if it is judged that the abnormality does not disturb the rewinding and discharging operations.

A sheet feeding operation of the microcapsule sheet and the developer sheet will be described hereunder.

In this image forming apparatus, the microcapsule sheet 11 continued to be fed by rotation of the sheet feed motor 156 until the trailing portion of a latent image on the microcapsule sheet 11 is fed through the pressure-developing unit 13 and passed through the separation roller 14d for separating the microcapsule sheet 11 from the developer sheet 16, and thus an unexposed portion of the microcapsule sheet 11 is also fed beyond the separation roller 14d. Therefore, after an exposure operation for a single copying process or a last exposure operation for a continuous copying process, the change-over clutch 37 is driven by the CPU 106 while the sheet feeding motor is rotated to thereby reverse the sheet feeding direction of the microcapsule sheet 11. As a result, the microcapsule sheet 11 is rewound until the unexposed portion of the microcapsule sheet 11 is disposed at a predetermined position where it can be subjected to a next exposure process. Accordingly, like the first control operation, the unexposed portion between the neighboring latent images is reduced in area and thus the microcapsule sheet can be effectively used.

If any abnormality occurs in the apparatus, the sheet feeding operation is controlled in accordance with a flowchart as shown in FIG. 7.

When any abnormality occurs in the apparatus during a continuous copying operation and thus an abnormality detection signal is outputted from at least one of the encoders 122 and 140 and the sensors 124 to 138, all of the operations including the driving operations of the sheet feeding motors 156 and 236 are ceased at steps S101 and S102. Thereafter, it is judged at a step S103 whether the rewinding operation of the microcapsule sheet 11 and the discharging operation of the developer sheet 16 are disturbed by the abnormality.

A judging operation at the step S103 is carried out in accordance with a flow-chart of FIG. 8.

First, it is judged at a step S103a whether an abnormality detection signal is outputted from the sheet jam sensor 124 for detecting the sheet jam of the microcapsule sheet and the developer sheet, and if it is judged not to be, it is judged at a step S103b whether the abnormality detection signal is outputted from the encoder 122 for detecting a sheet feed error of the sheet feeding motors 156 and 236. If it is judged that the abnormality is caused by the sheet jam or the sheet feed error at the steps S103a and S103b, it is judged that the abnormality disturbs the rewinding operation of the microcapsule sheet 11 or the discharging operation of the developer sheet 16.

If it is judged that the abnormality is not caused by the sheet jam and the sheet feed error, subsequently to the steps S103a and S103b, it is judged at a step S103d whether the abnormality detection signal is outputted from the photosensor 136 for detecting the break of the halogen lamp of the light source 5. If it is judged not to be, it is judged at a step S103e whether the abnormality detection signal is outputted from the sheet-empty sensor 32 for detecting the sheet empty of the microcapsule sheet 11 or the developer sheet 16. If one of the judgments at the steps S103d and S103e is "Yes", it is judged that the abnormality does not disturb the rewinding operation of the microcapsule sheet 11 or the discharging operation of the developer sheet 16. Thereafter, the sheet feeding motors 156 and 236 are driven to feed the microcapsule sheet 11 and the developer sheet 16 by a predetermined amount (length), and only the developer sheet feeding motor 236 is ceased after the developer sheet 16 is discharged (at steps S105 and S106). At this time, the change-over clutch 237 is driven to reverse the sheet feed direction of the microcapsule sheet 11 and rewind the microcapsule sheet 11 toward the exposure unit. After an unexposed portion of the microcapsule sheet 11 is fed back to the exposure unit, the driving of the microcapsule sheet feeding motor 156 and the change-over clutch 237 is ceased (at steps S107 to S108). Accordingly, even though an abnormality occurs during a continuous copying operation, the microcapsule sheet is not vainly used and thus effectively used.

The second control operation is not limited to the above embodiment. Any modification may be made insofar as it does not depart from the subject matter of this invention. For example, a sheet feeding means having a different construction from those of the first and second sheet feeding means (the microcapsule sheet feeding motor and the change-over clutch) may be used.

As described above, if an abnormality which does not disturb the sheet feeding operation of the developer sheet occurs during the continuous copying operation, an unexposed portion of the microcapsule sheet which is fed beyond the separation unit is completely fed back to the exposure unit and subjected to a next exposure process, so that the microcapsule sheet is effectively used.

What is claimed is:

1. An image forming apparatus for performing a series of image forming operations in which a photosensitive recording medium is exposed to light to form a latent image on the photosensitive recording medium and superposed over a developer medium under pressure to develop the latent image on the photosensitive recording medium into a visible image on the developer medium, comprising:

exposing means for exposing the photosensitive recording medium to an image light to form a latent image thereon in a first exposure process;

pressure-developing means for superposing the photosensitive recording medium having the latent image thereon over a developer medium under pressure, to thereby form a visible image corresponding to the latent image on the developer medium;

sheet feeding means for feeding the photosensitive recording medium through said exposing means and said pressure-developing means in forward and reverse directions to thereby perform sheet feeding and rewinding operations, respectively, the photosensitive recording medium being fed back in the rewinding operation after pressure-developed by said pressure-developing means to dispose an unexposed area of the photosensitive recording medium in the first exposure process to a predetermined position where the unexposed area is subjected to a second exposure process subsequent to the first exposure process; and control means for ceasing all of the image forming operations when any abnormality occurs during at least one of the image forming operations, wherein said control means controls said sheet feeding means to continue the sheet rewinding operation irrespective of occurrence of the abnormality if it is judged that the abnormality does not disturb the sheet rewinding operation.

2. An image forming apparatus as claimed in claim 1, further comprising sensor means for detecting any abnormality of at least one of the image forming operations, said control means ceasing the image forming operations upon detection of the abnormality.

3. An image forming apparatus as claimed in claim 2, wherein said control means includes judging means for judging on the basis of detection results of said sensor means as to whether the abnormality disturbs the rewinding operation of the photosensitive recording medium.

4. An image forming apparatus as claimed in claim 3, wherein said sensor means includes a sheet-jam sensor for detecting sheet jam of at least one of the photosensitive recording medium and the developer sheet and a sheet separation sensor for detecting complete separation of the photosensitive recording medium from the developer medium, and said judging means judges on the basis of detection results of the sheet-jam and sheet separation sensors as to whether the abnormality does not disturb the rewinding operation of the photosensitive recording medium.

5. An image forming apparatus as claimed in claim 1, further comprising sheet-feed distance detecting means for detecting a distance at which the photosensitive recording medium is rewound, said control means controlling said sheet feeding means on the basis of the detected distance so that the unexposed area of the photosensitive recording medium is disposed at the predetermined position.

6. An image forming apparatus as claimed in claim 1, wherein the predetermined position is a position within said exposing means or in front of said exposing means.

7. An image forming apparatus as claimed in claim 1, wherein said sheet feeding means comprises first feeding means for feeding the photosensitive recording medium in a sheet feed direction, second feeding means for feeding the developer medium and sheet feed direction switching means for reversing the sheet feed direction of the photosensitive recording medium to thereby perform the rewinding operation of the photosensitive recording medium.

8. An image forming apparatus for performing a series of image forming operations in which a photosensitive recording medium is exposed to light to form a latent image on the photosensitive recording medium and superposed over a developer medium under pressure to develop the latent image on the photosensitive recording medium into a visible image on the developer medium, comprising:

exposing means for exposing the photosensitive recording medium to an image light to form a latent image thereon in a first exposure process;

pressure-developing means for superposing the photosensitive recording medium having the latent image thereon over a developer medium under pressure, to thereby form a visible image corresponding to the latent image on the developer medium;

sheet feeding means for feeding the photosensitive recording medium through said exposing means and said pressure-developing means in forward and reverse directions to thereby perform sheet feeding and rewinding operations, respectively, the photosensitive recording medium being fed back in the rewinding operation after pressure-developed by said pressure-developing means to dispose an unexposed area of the photosensitive recording medium in the first exposure process to a predetermined position where the unexposed area is subjected to a second exposure process subsequent to the first exposure process; and control means for ceasing the image forming operations except for the sheet rewinding operation of said sheet feeding means when any abnormality occurs during at least one of the image forming operations and the abnormality is judged not to disturb the sheet rewinding operation, and continuing the sheet rewinding operation without interruption.

* * * * *